Figure 1:
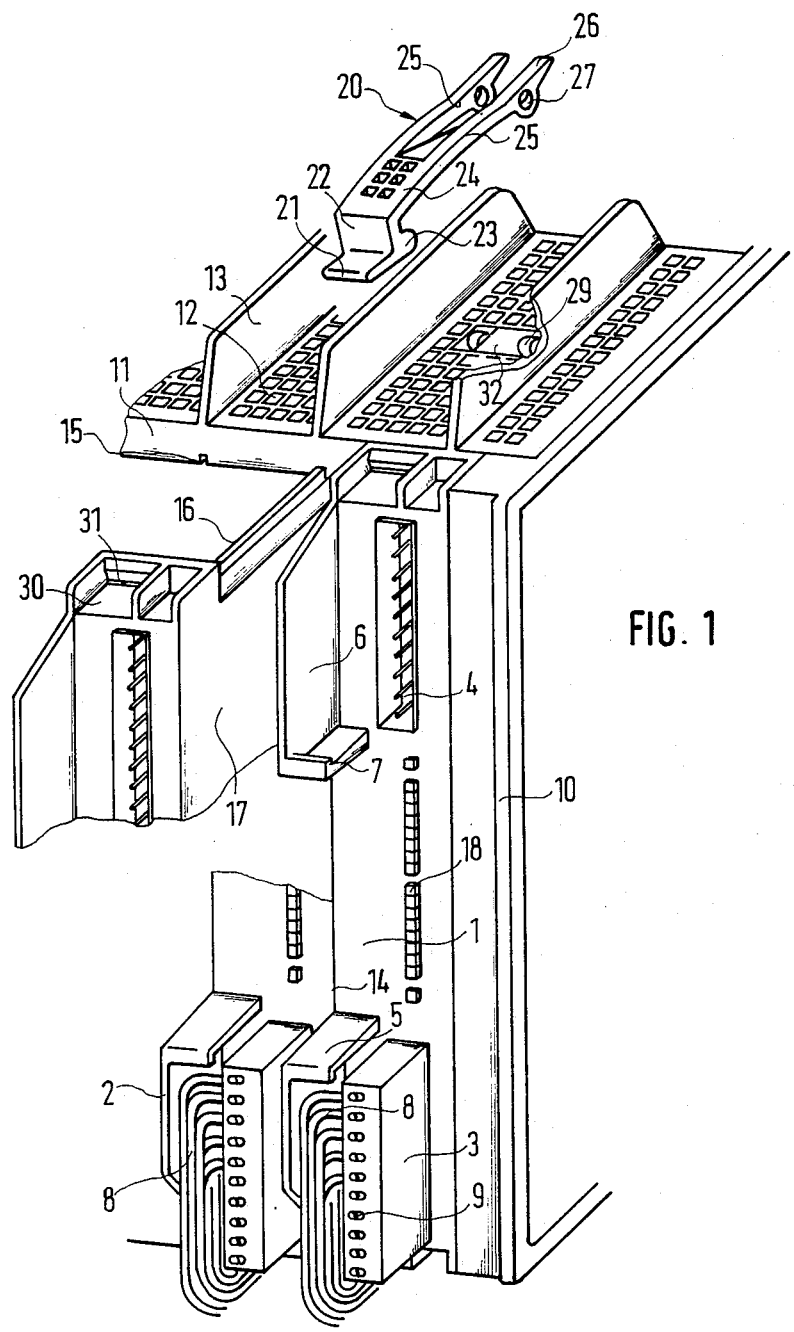

United States Patent [19]

Lichtensperger

[11] Patent Number: 4,873,614

[45] Date of Patent: Oct. 10, 1989

[54] ARRANGEMENT OF A MODULE WITHIN A CASING FRAME

[76] Inventor: Ernst Lichtensperger, Kleiststrasse 10, 8057, Eching, Fed. Rep. of Germany

[21] Appl. No.: 202,455

[22] Filed: Jun. 6, 1988

[30] Foreign Application Priority Data

Jun. 12, 1987 [DE] Fed. Rep. of Germany ....... 3719689

[51] Int. Cl.[4] .............................................. H02B 1/04
[52] U.S. Cl. ................................... 361/394; 361/415; 439/358
[58] Field of Search ................. 439/338-340, 439/358; 211/41; 16/225, 227, 229, 385; 292/DIG. 17, 84, 87, 285; 361/346, 383, 391-395, 413, 415, 428, 429, 399

[56] References Cited

U.S. PATENT DOCUMENTS

| | | | |
|---|---|---|---|
| 4,233,646 | 11/1980 | Lenng | 361/415 |
| 4,313,150 | 1/1982 | Chu | 361/415 |
| 4,327,835 | 5/1982 | Leser | 361/415 |
| 4,632,588 | 12/1986 | Fitzpatrick | 361/415 |
| 4,648,009 | 3/1987 | Beun | 361/415 |
| 4,751,613 | 6/1988 | Werdin | 361/415 |

Primary Examiner—Gerald P. Tolin
Attorney, Agent, or Firm—Marshall & Melhorn

[57] ABSTRACT

A special arrangement of a module with serial coupling possibility is described. The module is characterized by at least one angular attachment projecting vertically from the front or visible surface and which as a result of its arrangement and shaping serves as a gripping strip, cable guide and fastening aid. The fastening of the module within a casing frame is provided by a clip fastening (20) with two clearly defined swivel positions. Advantageously there are two angular attachments on the front of the module, which engage in spaced manner over the area of the connection sockets for the plugs along one longitudinal edge of the front side.

14 Claims, 2 Drawing Sheets

ARRANGEMENT OF A MODULE WITHIN A CASING FRAME

The invention relates to an enwise arrangement of a module with serial coupling possibility in accordance with the preamble of claim 1.

Modules with serials coupling possibilities for the most varied functions, such as for time relays, relay switches and random other electrical and/or electronic subassemblies are known which, within sealed casing units are locked to mounting rails e.g. cap rails and are wired together in the in each case most suitable manner. It is known in connection with modules of the present type that with regards to fixing to the rails they are lined up in a flat arrangement in juxtaposed manner on the rails, which requires a considerable amount of space and correspondingly complicated installations. An endwise lining up with a corresponding reconstruction of the spatial module structure, e.g. in the manner of the electronic plug-in units known from the existing European standard, helps to eliminate this problem, but causes new problems with regards the wiring, the endwise design, the now accessible front and the locking of each individual module within a casing frame.

The problem of the present invention is therefore to permit an endwise arrangement of modules, which ensures both an appropriate endwise connectability of the cable guide and also simple handlability during the removal and insertion of each individual module with respect to the casing frame, including the locking of the module within said frame without additional auxiliary means.

This problem is solved by the features given in the characterizing part of the main claim. Advantageous further developments of this can be gathered from the subclaims.

Due to the fact that there is at least one and preferably two spaced angular attachments projecting from the front of the module so as to be accessible in the installation position and therefore visible and which are in operative connection with a clip fastening, it is possible in a simple manner and without any additional space requirements, to ensure both a secure holding and guidance of the cable for the plug to be installed in this area and for the assembly, insertion and removal of the module from the associated terminal strips, as well as the counterhold required for the clip fastening. It is also particularly advantageous to provide the grip strips simultaneously serving as cable guides along one longitudinal edge of the front plate and aligned with respect thereto at an adequate distance from the plug, because as a result the in any case only narrow front side is not impaired with regards to its surface distribution. To make the angular attachment or attachments rectangular is an advantageous and optically attractive solution. However, it is also conceivable to round or in some other way curve this cross-sectional shape parallel to the front to ensure a reliable cable guide. The cable guide and grip fixing arrangement, particularly if the module front plate is made from plastic, can form an integral component of said front plate, so that no additional operations are required for the production thereof.

The clip fastening in the vicinity of the two terminal edges of the front plate projects from the lower and upper casing covers only with a very small surface cross-section into the front, or engages over the same at both ends, so that once again there is virtually no space requirement. Due to the particularly advantageous shaping of the clip fastening constructed in double lever form, two positions of the clip are fixed, namely that of the removal state, i.e. the open position and that of the closed state or position, in which the clip locks in an associated undercut on the front plate of the module.

The invention is described in greater detail hereinafter, relative to non-limitative embodiments and the attached drawings, wherein show:

FIG. 1: A sectional perspective partial representation of a casing frame with an inserted and a partly removed module.

Figure 2A:
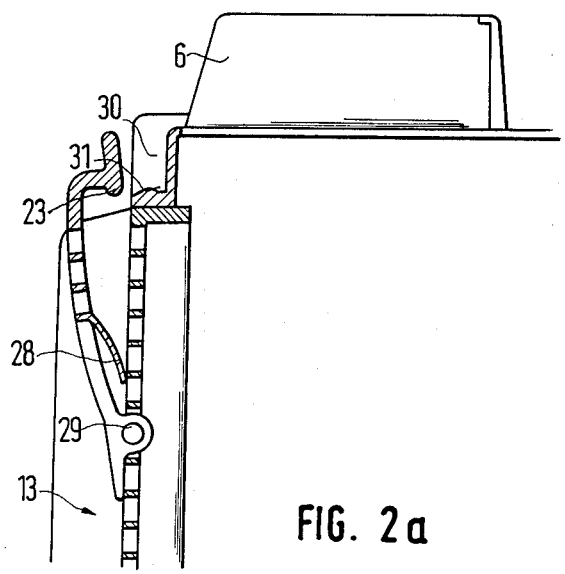
Figure 2B:
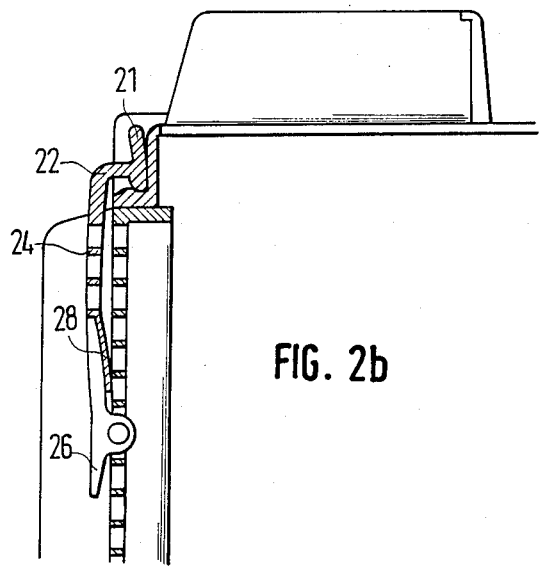

FIGS. 2a and 2b: Partial sections through the clip area of the arrangement with the clip in the open and closed positions.

As can be gathered from FIG. 1, a casing frame 10 receives a plurality of individual modules, whereof only the front side 1 is visible in the drawing. By means of guide grooves 15 and guide rails 16 sliding therein on the upper and lower edges of side walls 17, the modules are inserted or removed from the casing frame and are held by the latter in a clearly defined manner.

In another embodiment the guide rails 16 are formed by the edge of a printed circuit board received in the module and projecting over side walls 17.

The casing cover 11 reproduced perspectively in part sectional form is, like the casing base not shown in FIG. 1, in the form of a grid having grid openings 12, so that in the case of vertical installation of the individual modules within the casing frame, a good ventilation is ensured by an airflow through the same from bottom to top. Parallel, spaced ribs 13 provided along the casing cover 11 improve the stability and isertability of the arrangement, whilst ensuring an adequate ventilation. If several modules are juxtaposed, their vertical longitudinal edges 14 are tightly adjacently spaced to one another, as shown in the lower half of FIG. 1, so that substantially the entire front face of the casing frame 10 can be occupied with slide-in modules, without losing unnecessary space. The front one of each module is provided with angular attachments projecting vertically from the same and located in aligned manner to in each case one longitudinal edge 14 and said attachments form gripping strips and cable guides. In cross-section and namely in a plane at right angles to the front, said angular attachments and L-shaped and have a short leg 5 and a long leg 6. Short leg 5 is at right angles to long leg 6 and projects from said longitudinal edge 14 of the module and therefore emanating from long leg 6 into the vicinity of the center of said front plate and in spaced manner projects on the front side over the area of a connector socket parallel to the long leg on both end sides, i.e. at the bottom and top. Each connector socket 4 receives a plug 3 from which, in the represented manner, passes a cable harness with a plurality of cables 8 and for the actual plugs 3 on one side and the angular attachment on the other is provided a clearly defined guide groove, which leads up to the lower casing over and within its spacing system the cable harness can be led up to the rear area of casing frame 10. By means of conventional cable locking means 9, the ends thereof are directly connected to the plug connections within the socket 3. The lug-like projection 7 on the short leg 5 of angular attachment 2 serves in particular to give a better grip to the double grip and e.g. the index finger and thumb can be pressed on the two directed away from one another projection 7 of short leg 5, in order to remove from or insert with respect to the casing frame a module following the release of clip 20 and reference will be made to this hereinafter. A completely satisfactory guidance of the individual cable harnesses leading away from plug 3 into the rear area of the casing frame is ensured between ribs 13 and is not affected by the clips 20.

In the central area of the front 1 of each module in the present embodiment are provided optical display elements 18, such as e.g. light emitting diodes and alongside these can be provided the function for the particular operation in the form of a not shown inscirption table. The optical display elements can also be in the form of keys, pushbuttons, etc.

In the present embodiment, the clip 20 is made from an injection moulding from a sufficiently resilient or elastically pliable plastic and essentially constitutes a double lever, which can be engaged in the articulated connection 29 within a hinge fastening 32. For this purpose, the clip 20 is constructed in the rear part as a dovetail arrangement 25, with swivel bearings 27, which by forcing the two dovetails towards one another can be positively engaged in the hinge fastenings 32 which serve as bearings. The V-shaped wedge of each dovetail 25 behind the swivel bearing 27 of hinge fastening 32 forms a swivel limit 26 for clip 20, as that in the open position shown in FIG. 2, it can only swing out by a given angle and is pretensioned by means of a spring lug 28. In the case of a suitable choice of clip material, the spring lug 28 can form an integral component of the clip. The spring lug 28 is a tongue-like member located between the dovetail arrangement 25 and passing away therefrom in an acute-angled manner.

The front part of clip 20 in FIG. 1 is characterized by the broken away central portion 24, to which are connected further to the front the bend 22 and to the latter the operating lug 21, together with the locking nose 23. As can in particular be gathered from FIGS. 2a and 2b locking nose 23 engages on pressing the clip 20 against the bias of spring lug 28 in its closed position in an undercut 31 of a recess 30 of the module front 1 and forms a positive and non-positive locking. Slight pressure against the back of the operating lug 21 releases the clip locking system, which is not sensitive to shaking and other mechanical stresses, without requiring auxiliary means, such as a screwdriver or the like.

I claim:

1. In combination, a casing frame having removable modular electronic subassemblies inserted endwise therein in side-by-side relation, each said subassembly comprising a module having upper and lower edges, opposite side walls and a front wall, said front wall including at least one connector socket for receiving a plug of a cable harness and an L-shaped attachment projecting from said front wall adjacent said at least one connector socket, and fastener means for locking each said module within said casing frame, each said fastener means comprising a resilient lever removably and hingedly connected at one end to said casing frame, said lever being formed at its opposite end with a locking nose, and a recess in each said module for lockingly receiving said locking nose.

2. The combination of claim 1, wherein said casing frame includes a hinge fastening comprising spaced aligned posts, said lever including two spaced dovetails at said one end, and a swivel bearing recess in each said dovetail, said dovetails being resiliently inwardly deflectable toward one another for inserting said posts in said swivel bearing recesses to hingedly connect said lever to said casing frame.

3. The combination of claim 2, wherein said lever includes a swivel limit portion extending rearwardly beyond said hinge fastening, and a spring lug member between said dovetails diverging therefrom at an acute angle whereby outward swing of said lever is limited by said swivel limit portion and said lever is pre-tensioned by said spring lug member as it is latched.

4. The combination of claim 1, including a second connector socket and L-shaped attachment on each module, each said L-shaped attachment comprising a long leg extending along one of said side walls of said module and a short leg extending generally transversely of said side wall, and a projection on the surface of each said short leg facing the upper and lower edges of said module whereby said short legs serve as finger grips for said module.

5. Arrangement according to claim 1, wherein there are two said L-shaped attachments on the front wall of each said module, said L-shaped attachments extending over the area of a spaced pair of connector sockets for terminal plugs located along said front wall of said module.

6. Arrangement according to claim 5, wherein each said L-shaped attachment has a short leg extending transversely of said front wall and a long leg extending along a said edge.

7. Arrangement according to claim 6, wherein the short leg of each said L-shaped attachment extends perpendicularly from the longitudinal edge of the module towards the center of the front of said module so as to serve as a gripping strip for the removal or insertion of the module with respect to the casing frame.

8. Arrangement according to claim 6, wherein said long leg of each said L-shaped attachment is aligned with one of the longitudinal edges of the module.

9. Arrangement according to claim 6, wherein said short leg of each said L-shaped attachment forms a counter support for said fastening means.

10. Arrangement according to claim 1, wherein said lever comprises two spaced dovetails with a swivel bearing in each said dovetail engaged in a hinge fastening within said casing frame.

11. Arrangement according to claim 10, wherein said dovetails are flexible and the hinge fastening of said fastening means can be snapped into articulated connections of fastening within said casing frame.

12. Arrangements according to claim 11, wherein the lever has a resilient lug comprising a tongue spring between the two dovetails, directed at an acute angle therefrom towards the casing frame.

13. Arrangement according to claim 1, wherein said front wall forming the front of each said module, together with said L-shaped attachment, is a one piece integral unit.

14. Arrangement according to claim 1, wherein the lever is an elastically deformable molding.

* * * * *